United States Patent
Tarrago et al.

(10) Patent No.: US 10,338,811 B2
(45) Date of Patent: Jul. 2, 2019

(54) USER INTERFACE FOR THREE-DIMENSIONAL MODELLING

(71) Applicant: Atomic Shapes Oy, Helsinki (FI)

(72) Inventors: Oriol Semente Tarrago, Espoo (FI); Ashish Mohite, Helsinki (FI); Pouria Khademolhosseini, Helsinki (FI)

(73) Assignee: ATOMIC SHAPES OY, Helsinki (FI)

( * ) Notice: Subject to any disclaimer, the term of this patent is extended or adjusted under 35 U.S.C. 154(b) by 343 days.

(21) Appl. No.: 15/229,473

(22) Filed: Aug. 5, 2016

(65) Prior Publication Data

US 2017/0038968 A1    Feb. 9, 2017

Related U.S. Application Data

(60) Provisional application No. 62/201,686, filed on Aug. 6, 2015.

(51) Int. Cl.
| | |
|---|---|
| *G06F 3/0488* | (2013.01) |
| *G06F 3/041* | (2006.01) |
| *G06F 3/0484* | (2013.01) |
| *G06T 17/20* | (2006.01) |
| *G06T 19/20* | (2011.01) |
| *G06F 3/0481* | (2013.01) |

(52) U.S. Cl.
CPC ........ *G06F 3/04886* (2013.01); *G06F 3/0414* (2013.01); *G06F 3/0416* (2013.01); *G06F 3/04815* (2013.01); *G06F 3/04842* (2013.01); *G06F 3/04845* (2013.01); *G06T 19/20* (2013.01); *G06T 2219/2016* (2013.01); *G06T 2219/2021* (2013.01)

(58) Field of Classification Search
CPC ........ G06T 19/00; G06T 17/20; G06T 17/00; G06T 15/10; G06T 15/00; G06T 17/205; G06T 15/04; G06T 11/40; G06T 15/005
See application file for complete search history.

(56) References Cited

U.S. PATENT DOCUMENTS 6,392,647 B1 * 5/2002 Migdal ................... G06T 17/20
                                                              345/423
8,902,232 B2 * 12/2014 Debevec ................. G06T 13/40
                                                              345/423

(Continued)

FOREIGN PATENT DOCUMENTS

WO    WO-2011011898 A1 *  2/2011  ............... G06F 3/01

*Primary Examiner* — Todd Buttram
(74) *Attorney, Agent, or Firm* — Ziegler IP Law Group, LLC

(57) ABSTRACT

Providing a user interface for three-dimensional (3D) modelling, via an apparatus with a touch surface includes displaying a 3D model of a virtual object having an elementary shape. A virtual mesh is displayed over or aside at least a portion of the virtual object. Regions of the virtual mesh are mapped onto regions located on the touch surface. Select of a type and/or a shape of a modification to be performed on the 3D model of the virtual object is detected together with a force applied by the user on a region of the touch surface. A region of the virtual mesh corresponding to the at least one region of the touch surface is determined. The elementary shape of the virtual object is modified corresponding to the region of the virtual mesh, based upon the user's selection. The modified 3D model of the virtual object is displayed.

11 Claims, 8 Drawing Sheets

(56) References Cited

U.S. PATENT DOCUMENTS

| | | | |
|---|---|---|---|
| 2011/0164029 A1* | 7/2011 | King | G06F 3/04883 345/419 |
| 2013/0242054 A1* | 9/2013 | Chiu | G06T 17/00 348/46 |
| 2013/0268862 A1* | 10/2013 | Glaser | G06F 3/04847 715/738 |
| 2013/0300734 A1* | 11/2013 | Schmidt | G06T 17/20 345/419 |
| 2016/0284123 A1* | 9/2016 | Hare | G06T 7/55 |
| 2018/0114368 A1* | 4/2018 | Marketsmueller | G06F 3/0482 |

* cited by examiner

US 10,338,811 B2

USER INTERFACE FOR THREE-DIMENSIONAL MODELLING

TECHNICAL FIELD

The present disclosure relates generally to three-dimensional (3D) modelling; and more specifically, to methods of providing a user interface for 3D modelling. Moreover, the present disclosure relates to apparatus for providing a user interface for 3D modelling.

BACKGROUND

Three-dimensional (3D) modelling is a rapidly growing business, especially due to an increasing availability of 3D printers for domestic use.

Conventionally, 3D models are created using Computer-Aided Design (CAD) software. However, conventional CAD software are difficult to use, and can only be used by trained professionals.

In light of the foregoing, there exists a need for an easy to use and user-friendly way of creating a 3D model.

SUMMARY

The present disclosure seeks to provide an improved method of providing a user interface for three-dimensional (3D) modelling.

The present disclosure also seeks to provide an improved apparatus for providing a user interface for 3D modelling.

A further aim of the present disclosure is to at least partially overcome at least some of the problems of the prior art, as discussed above.

In a first aspect, embodiments of the present disclosure provide a method of providing a user interface for 3D modelling, via an apparatus comprising a touch surface, the method comprising:
displaying a 3D model of a virtual object having at least one elementary shape;
displaying a virtual mesh over or aside at least a portion of the virtual object, wherein the virtual mesh comprises a plurality of regions;
mapping the plurality of regions of the virtual mesh onto a plurality of regions located on the touch surface;
detecting a user's selection of a type and/or a shape of a modification to be performed on the 3D model of the virtual object;
detecting a force applied by the user on at least one region of the touch surface;
determining at least one region of the virtual mesh corresponding to the at least one region of the touch surface;
modifying the at least one elementary shape of the virtual object corresponding to the at least one region of the virtual mesh, based upon the user's selection of the type and/or the shape of the modification to be performed; and
displaying the modified 3D model of the virtual object.

In a second aspect, embodiments of the present disclosure provide an apparatus for providing a user interface for 3D modelling, the apparatus comprising:
a memory;
a processor coupled to the memory;
a display coupled to the processor; and
a touch surface coupled to the processor,
wherein the processor is configured to:
display, on the display, a 3D model of a virtual object having at least one elementary shape;
display, on the display, a virtual mesh over or aside at least a portion of the virtual object, wherein the virtual mesh comprises a plurality of regions;
map the plurality of regions of the virtual mesh onto a plurality of regions located on the touch surface;
detect a user's selection of a type and/or a shape of a modification to be performed on the 3D model of the virtual object;
detect a force applied by the user on at least one region of the touch surface;
determine at least one region of the virtual mesh corresponding to the at least one region of the touch surface;
modify the at least one elementary shape of the virtual object corresponding to the at least one region of the virtual mesh, based upon the user's selection of the type and/or the shape of the modification to be performed; and
display, on the display, the modified 3D model of the virtual object.

In a third aspect, embodiments of the present disclosure provide an apparatus for providing a user interface for 3D modelling, the apparatus comprising:
a user input device comprising a touch surface; and
a computing device coupled in communication with the user input device, wherein the computing device comprises:
a memory;
a processor coupled to the memory; and
a display coupled to the processor,
wherein the processor is configured to:
display, on the display, a 3D model of a virtual object having at least one elementary shape;
display, on the display, a virtual mesh over or aside at least a portion of the virtual object, wherein the virtual mesh comprises a plurality of regions;
map the plurality of regions of the virtual mesh onto a plurality of regions located on the touch surface;
detect a user's selection of a type and/or a shape of a modification to be performed on the 3D model of the virtual object;
detect a force applied by the user on at least one region of the touch surface;
determine at least one region of the virtual mesh corresponding to the at least one region of the touch surface;
modify the at least one elementary shape of the virtual object corresponding to the at least one region of the virtual mesh, based upon the user's selection of the type and/or the shape of the modification to be performed; and
display, on the display, the modified 3D model of the virtual object.

Embodiments of the present disclosure substantially eliminate or at least partially address the aforementioned problems in the prior art, and facilitate a user-friendly user interface that enables users to perform 3D modelling in a quick and easy manner.

Additional aspects, advantages, features and objects of the present disclosure would be made apparent from the drawings and the detailed description of the illustrative embodiments construed in conjunction with the appended claims that follow.

It will be appreciated that features of the present disclosure are susceptible to being combined in various combinations without departing from the scope of the present disclosure as defined by the appended claims.

BRIEF DESCRIPTION OF THE DRAWINGS

The summary above, as well as the following detailed description of illustrative embodiments, is better understood when read in conjunction with the appended drawings. For the purpose of illustrating the present disclosure, exemplary constructions of the disclosure are shown in the drawings. However, the present disclosure is not limited to specific methods and instrumentalities disclosed herein. Moreover, those in the art will understand that the drawings are not to scale. Wherever possible, like elements have been indicated by identical numbers.

Embodiments of the present disclosure will now be described, by way of example only, with reference to the following diagrams wherein.

Figure 1:
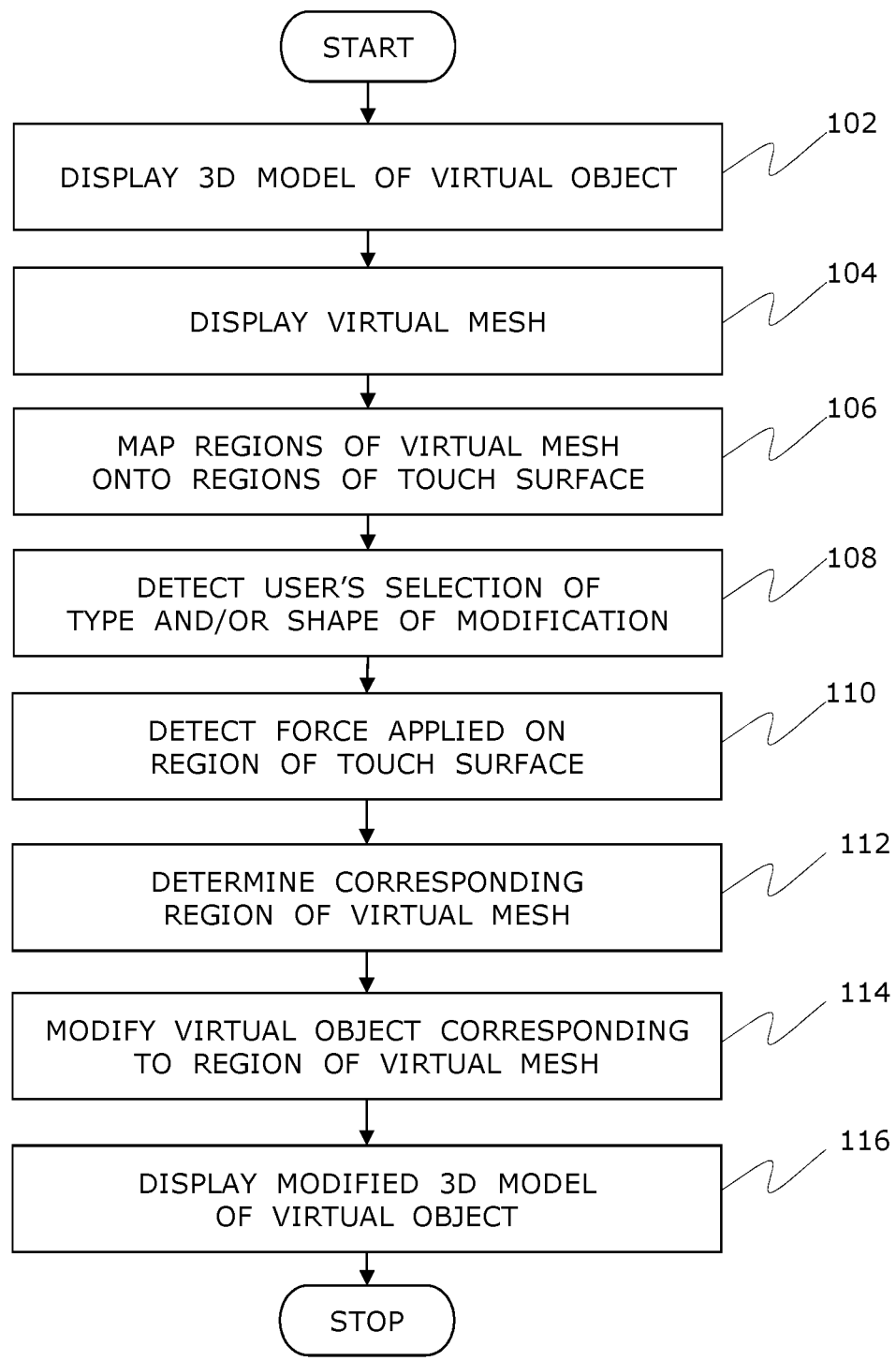
FIG. 1 is an illustration of steps of a method of providing a user interface (UI) for three-dimensional (3D) modelling, via an apparatus comprising a touch surface, in accordance with an embodiment of the present disclosure.

In the accompanying drawings, an underlined number is employed to represent an item over which the underlined number is positioned or an item to which the underlined number is adjacent. A non-underlined number relates to an item identified by a line linking the non-underlined number to the item. When a number is non-underlined and accompanied by an associated arrow, the non-underlined number is used to identify a general item at which the arrow is pointing.

Detailed Description of Embodiments

The following detailed description illustrates embodiments of the present disclosure and ways in which they can be implemented. Although some modes of carrying out the present disclosure have been disclosed, those skilled in the art would recognize that other embodiments for carrying out or practicing the present disclosure are also possible.

Glossary

Brief definitions of terms used throughout the present disclosure are given below.

The term "force" encompasses a substantial force applied by a user on a touch surface of an apparatus as well as a mere touch applied by the user on the touch surface of the apparatus.

The term "extent of force" generally refers to a magnitude of force applied by the user.

The terms "connected" or "coupled" and related terms are used in an operational sense and are not necessarily limited to a direct connection or coupling. Thus, for example, two devices may be coupled directly, or via one or more intermediary media or devices. As another example, devices may be coupled in such a way that information can be passed there between, while not sharing any physical connection with one another. Based upon the present disclosure provided herein, one of ordinary skill in the art will appreciate a variety of ways in which connection or coupling exists in accordance with the aforementioned definition.

The terms "first", "second", and the like, herein do not denote any order, quantity, or importance, but rather are used to distinguish one element from another. Furthermore, the terms "a" and "an" herein do not denote a limitation of quantity, but rather denote the presence of at least one of the referenced item.

The phrases "in an embodiment", "in accordance with an embodiment" and the like generally mean the particular feature, structure, or characteristic following the phrase is included in at least one embodiment of the present disclosure, and may be included in more than one embodiment of the present disclosure. Importantly, such phrases do not necessarily refer to the same embodiment.

If the specification states a component or feature "may", "can", "could", or "might" be included or have a characteristic, that particular component or feature is not required to be included or have the characteristic.

Embodiments of the Present Disclosure

In a first aspect, embodiments of the present disclosure provide a method of providing a User Interface (UI) for three-dimensional (3D) modelling, via an apparatus comprising a touch surface, the method comprising:

displaying a 3D model of a virtual object having at least one elementary shape;

displaying a virtual mesh over or aside at least a portion of the virtual object, wherein the virtual mesh comprises a plurality of regions;

mapping the plurality of regions of the virtual mesh onto a plurality of regions located on the touch surface;

detecting a user's selection of a type and/or a shape of a modification to be performed on the 3D model of the virtual object;

detecting a force applied by the user on at least one region of the touch surface;

determining at least one region of the virtual mesh corresponding to the at least one region of the touch surface;

modifying the at least one elementary shape of the virtual object corresponding to the at least one region of the virtual mesh, based upon the user's selection of the type and/or the shape of the modification to be performed; and displaying the modified 3D model of the virtual object.

According to an embodiment of the present disclosure, the modified 3D model of the virtual object is displayed in real time or near real time. This provides an immediate visual feedback to the user, and potentially facilitates an uninterrupted 3D modelling process.

Examples of the at least one elementary shape include, but are not limited to, a cylindrical shape, a cubical shape, a cuboidal shape, a spherical shape and a conical shape.

It will be appreciated that virtual objects having more complex shapes can be designed by compositing virtual objects of simple elementary shapes. Thus, the method is suitable for 3D modelling of both virtual objects having elementary shapes and virtual objects having complex shapes.

Moreover, according to an embodiment of the present disclosure, the method comprises detecting a user's selection of a surface of the virtual object to be modified, wherein the modification is performed on the surface of the virtual object that is selected by the user. In other words, the method optionally includes enabling the user to select a surface of the virtual object to which the user desires to perform the modification. It will be appreciated that the method potentially enables the user to select any surface of the virtual object.

Optionally, the surface of the virtual object selected by the user is an external surface of the virtual object. Alternatively, optionally, the surface of the virtual object selected by the user is an internal surface of the virtual object. As an example, the user can select an internal surface of a glass or a cup to perform the modification.

Optionally, when the internal surface of the virtual object is being modified, the external surface of the virtual object is displayed using a ghosting effect.

Optionally, the virtual object includes at least a first object and a second object, wherein the second object lies within the first object. Optionally, in such a case, the method not only enables the user to select any surface of the first object, but also enables the user to select any surface of the second object for modifying as per user's desire.

Moreover, optionally, the type of the modification to be performed defines whether the at least one elementary shape of the virtual object is to be modified in a symmetrical manner or in an asymmetrical manner. Optionally, in this regard, the method includes enabling the user to select a type of material whose properties the virtual object is desired to have during the modification, wherein the modification is performed in a symmetrical manner or in an asymmetrical manner depending upon the type of material that is selected by the user. Examples of the type of material include, but are not limited to, a clay-like material and a metal-like material.

As an example, when the user selects a clay-like material, the modification is performed in a symmetrical manner, namely in a manner that is substantially similar to how a modification is performed in traditional pottery. In such a case, the method optionally includes displaying the virtual object as a rotating object, namely as an emulation of an object on a spinning potter's wheel.

As another example, when the user selects a metal-like material, the modification is performed in an asymmetrical manner, namely in a manner that is substantially similar to how a modification is performed in a metallic object. In such a case, the virtual object is modified asymmetrically at a given portion of the virtual object, without influencing other portions of the virtual object.

Moreover, optionally, the type of the modification defines whether the modification to be performed on the at least one elementary shape of the virtual object is a protrusion or a depression. Examples of such modifications have been illustrated in conjunction with FIGS. 6 and 7.

Moreover, optionally, the shape of the modification defines a shape to be achieved after the modification is performed. Examples of such a shape include, but are not limited to, a curved shape, an angular shape, a concave shape, a convex shape, an up-pointing shape and a down-pointing shape.

Additionally, optionally, the type and the shape of the modification to be performed correspond to a creation of a bridge on the virtual object. As an example, a 3D model of a cup can be designed by modifying a cylindrical object, and then creating a bridge on the modified object, namely an ear of the cup. Optionally, when creating the bridge, the method includes enabling the user to select at least two regions at which the bridge joins the virtual object; and enabling the user to modify a shape of the bridge.

According to an embodiment of the present disclosure, the method includes:

displaying a plurality of user-selectable options for modifying the at least one elementary shape of the virtual object; and enabling the user to select the type and/or the shape of the modification by way of at least one of the plurality of user-selectable options.

Optionally, the plurality of user-selectable options are displayed in a form of icons. Optionally, in this regard, a given user-selectable option from amongst the plurality of user-selectable options is selected using an input device, for example, such as a mouse pointer or a touchscreen.

Furthermore, according to an embodiment of the present disclosure, the modification is performed based upon an extent of the force applied by the user and/or a duration for which the force is applied by the user.

Moreover, according to an embodiment of the present disclosure, the method comprises enabling the user to translate and/or resize the virtual mesh in a dynamic manner.

Optionally, such translation and/or resizing is enabled by way of certain gestures that are performed on the touch surface of the apparatus. In one example implementation, the virtual mesh is resized when the user makes a predefined resizing gesture on the touch surface of the apparatus. The predefined resizing gesture can be either user-defined or system-defined by default. As an example, the predefined resizing gesture is a multi-touch zoom gesture, which is well known in the art. It will be appreciated that any suitable touch gesture can be used as the predefined resizing gesture.

Additionally or alternatively, optionally, such translation and/or resizing is enabled by way of other input devices, for example, such as a mouse pointer, a joy stick, a keyboard and the like.

Moreover, according to an embodiment of the present disclosure, the method includes providing, within the virtual mesh, a predefined number of precision levels. The predefined number may be either user-defined or system-defined by default.

Optionally, the precision levels are scalable. More optionally, the precision levels are scalable to a desired resolution, depending on a change in a size of the virtual mesh.

For illustration purposes only, there will now be considered an example implementation in which the number of precision levels is 10. In such a case, a precision, namely a resolution, provided by the precision levels of the virtual mesh depends on a distance between a first precision level and a tenth precision level from amongst the precision levels. As an example, the precision can be calculated as a distance between the first precision level and the tenth precision level divided by 10.

It will be appreciated that the number of precision levels is not limited to 10, and can be any number, for example, such as 5, 20, 100 and so on.

Figure 6:
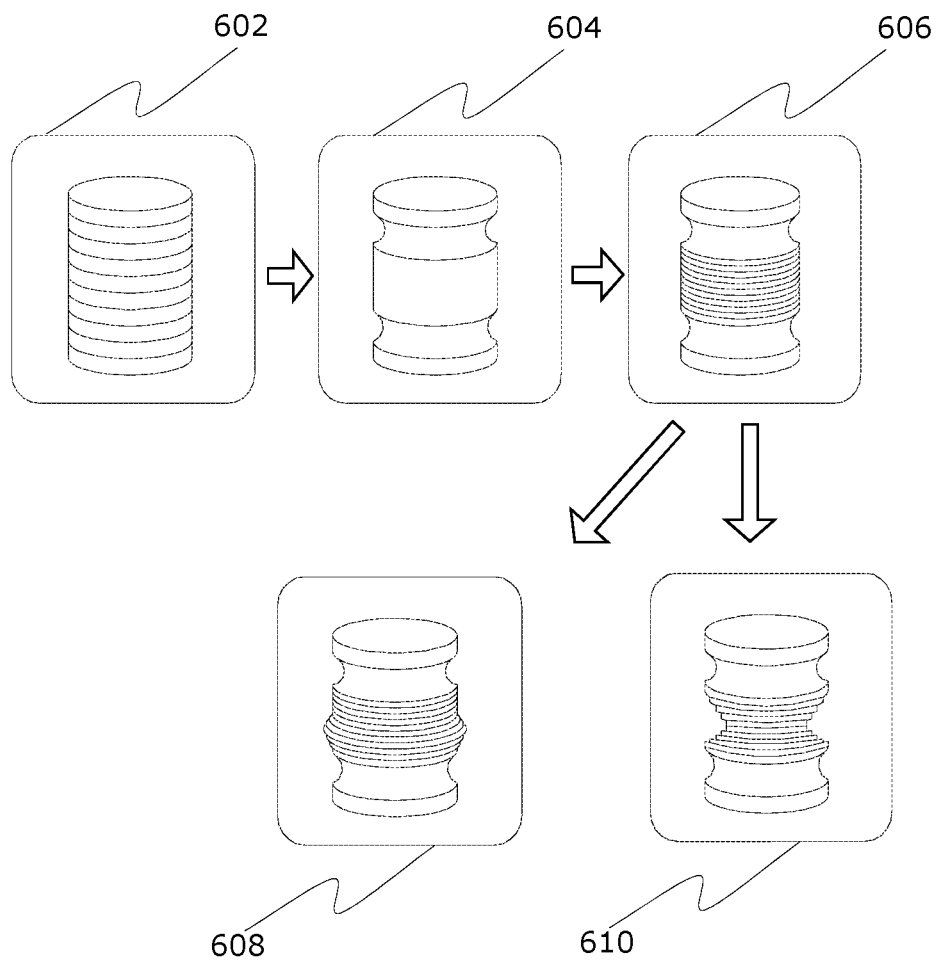
FIG. 6 is a schematic illustration of how precision levels of a virtual mesh are scaled when a 3D modelling process is performed, in accordance with an embodiment of the present disclosure.
Figure 7:
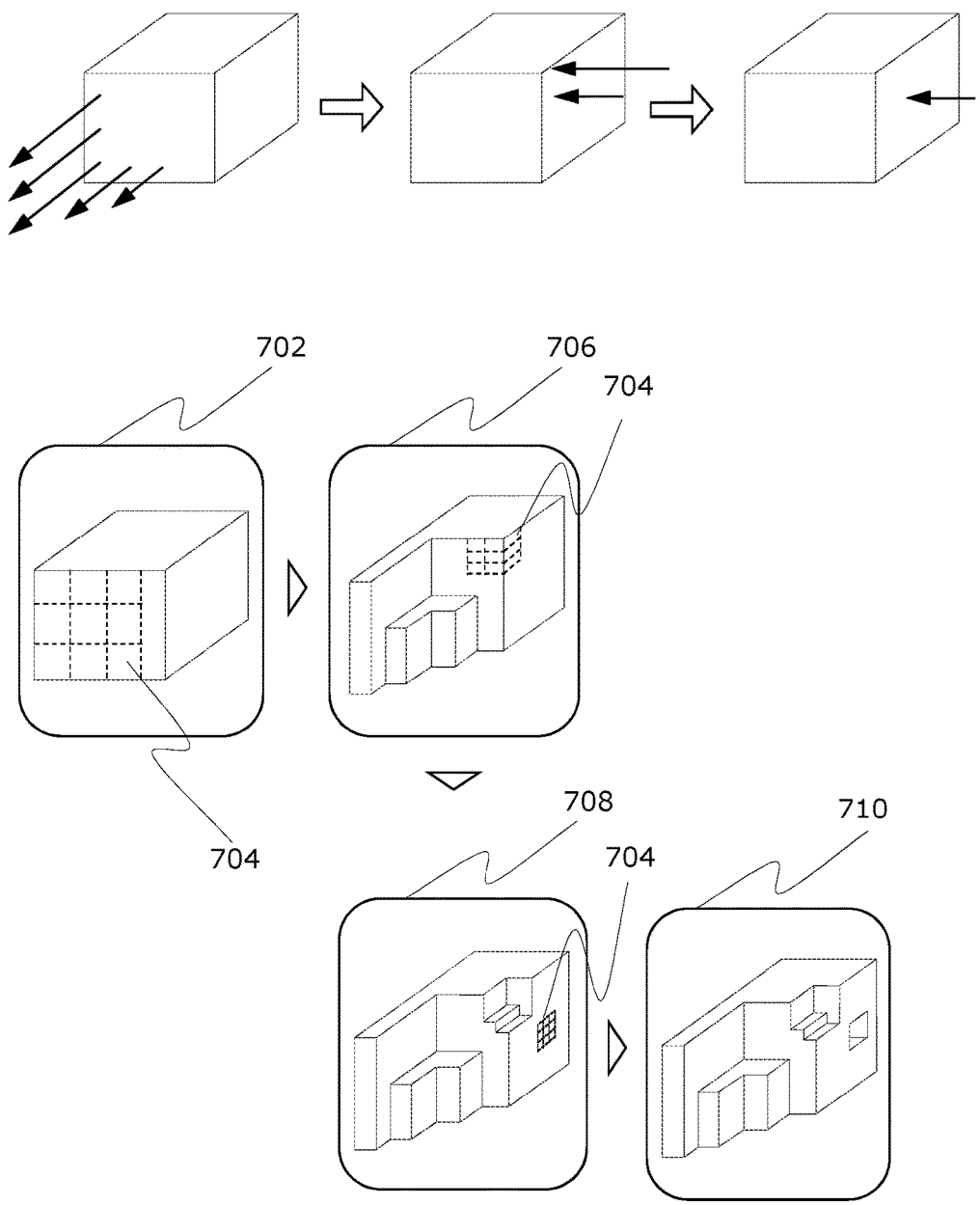
FIG. 7 is a schematic illustration of how precision levels of a virtual mesh are scaled when a 3D modelling process is performed, in accordance with an embodiment of the present disclosure.

Examples of how the precision levels can be scaled have been illustrated in conjunction with FIGS. 6 and 7.

Moreover, according to an embodiment of the present disclosure, the method includes storing the 3D model of the virtual object in a form of an editable file or in a 3D printable format.

Optionally, when stored in the form of an editable file, the editable file has a file format that is compatible with known 3D modelling software. This potentially enables the user to access the 3D model of the virtual object from the editable file in future, for example, to make further modifications in the 3D model of the virtual object.

Storing the 3D model of the virtual object in the 3D printable format potentially enables the user to print the 3D model of the virtual object using a 3D printing technology.

An example of the 3D printable format is the STereoLithography (STL) format, which has a file extension ".stl".

Moreover, optionally, the 3D model of the virtual object is stored at a local data storage of the apparatus. Additionally or alternatively, optionally, the 3D model of the virtual object is stored at a remote server. Optionally, the remote server is implemented by way of a cloud computing service.

Furthermore, according to an embodiment of the present disclosure, the apparatus is implemented by way of a computing device. Examples of such computing devices include, but are not limited to, smart telephones, Mobile Internet Devices (MIDs), tablet computers, Ultra-Mobile Personal Computers (UMPCs), phablet computers, Personal Digital Assistants (PDAs), web pads, Personal Computers (PCs), handheld PCs, laptop computers, desktop computers, and large-sized touchscreens with embedded PCs.

Optionally, in such a case, the touch surface is implemented by way of a touchscreen display of the computing device. Alternatively, optionally, the touch surface is implemented by way of a touchpad of the computing device. The touchpad could be implemented as an in-built touchpad of the computing device or as an external touchpad that is communicably coupled to the computing device.

When the touch surface is implemented by way of a touchscreen display, the aforementioned plurality of regions of the virtual mesh are mapped onto the plurality of regions located on the touchscreen display, namely the touch surface. In such a case, the method enables the user to provide his/her inputs, namely apply force, over the virtual mesh displayed on the touchscreen display.

In a second aspect, embodiments of the present disclosure provide an apparatus for providing a UI for 3D modelling, the apparatus comprising:
a memory;
a processor coupled to the memory;
a display coupled to the processor; and
a touch surface coupled to the processor,
wherein the processor is configured to:
  display, on the display, a 3D model of a virtual object having at least one elementary shape;
  display, on the display, a virtual mesh over or aside at least a portion of the virtual object, wherein the virtual mesh comprises a plurality of regions;
  map the plurality of regions of the virtual mesh onto a plurality of regions located on the touch surface;
  detect a user's selection of a type and/or a shape of a modification to be performed on the 3D model of the virtual object;
  detect a force applied by the user on at least one region of the touch surface;
  determine at least one region of the virtual mesh corresponding to the at least one region of the touch surface;
  modify the at least one elementary shape of the virtual object corresponding to the at least one region of the virtual mesh, based upon the user's selection of the type and/or the shape of the modification to be performed; and
  display, on the display, the modified 3D model of the virtual object.

According to an embodiment of the present disclosure, the processor is configured to display the modified 3D model of the virtual object in real time or near real time. This provides an immediate visual feedback to the user, and potentially facilitates an uninterrupted 3D modelling process.

Examples of the at least one elementary shape include, but are not limited to, a cylindrical shape, a cubical shape, a cuboidal shape, a spherical shape and a conical shape.

It will be appreciated that virtual objects having more complex shapes can be designed by compositing virtual objects of simple elementary shapes. Thus, the apparatus is suitable for 3D modelling of both virtual objects having elementary shapes and virtual objects having complex shapes.

Moreover, according to an embodiment of the present disclosure, the processor is configured to detect a user's selection of a surface of the virtual object to be modified, wherein the modification is to be performed on the surface of the virtual object that is selected by the user. In other words, the processor is optionally configured to enable the user to select a surface of the virtual object to which the user desires to perform the modification. It will be appreciated that the processor is optionally configured to enable the user to select any surface of the virtual object.

Moreover, optionally, the type of the modification to be performed defines whether the at least one elementary shape of the virtual object is to be modified in a symmetrical manner or in an asymmetrical manner. Optionally, in this regard, the processor is configured to enable the user to select a type of material whose properties the virtual object is desired to have during the modification, wherein the modification is performed in a symmetrical manner or in an asymmetrical manner depending upon the type of material that is selected by the user, as described earlier.

Moreover, optionally, the type of the modification defines whether the modification to be performed on the at least one elementary shape of the virtual object is a protrusion or a depression. Examples of such modifications have been illustrated in conjunction with FIGS. 6 and 7.

Moreover, optionally, the shape of the modification defines a shape to be achieved after the modification is performed. Examples of such a shape include, but are not limited to, a curved shape, an angular shape, a concave shape, a convex shape, an up-pointing shape and a down-pointing shape.

Additionally, optionally, the type and the shape of the modification to be performed correspond to a creation of a bridge on the virtual object. As an example, a 3D model of a cup can be designed by modifying a cylindrical object, and then creating a bridge on the modified object, namely an ear of the cup. Optionally, when creating the bridge, the processor is configured to enable the user to select at least two regions at which the bridge joins the virtual object; and to enable the user to modify a shape of the bridge.

According to an embodiment of the present disclosure, the processor is configured to:
display a plurality of user-selectable options for modifying the at least one elementary shape of the virtual object; and
enable the user to select the type and/or the shape of the modification by way of at least one of the plurality of user-selectable options.

Optionally, the plurality of user-selectable options are displayed in a form of icons. Optionally, in this regard, a given user-selectable option from amongst the plurality of user-selectable options is selected using an input device, for example, such as a mouse pointer or a touchscreen, coupled to the processor.

Furthermore, according to an embodiment of the present disclosure, the processor is configured to perform the modification based upon an extent of the force applied by the user and/or a duration for which the force is applied by the user.

Moreover, according to an embodiment of the present disclosure, the processor is configured to enable the user to translate and/or resize the virtual mesh in a dynamic manner.

Optionally, such translation and/or resizing is enabled by way of certain gestures that are performed on the touch surface of the apparatus. Additionally or alternatively, optionally, such translation and/or resizing is enabled by way of other input devices, for example, such as a mouse pointer, a joy stick, a keyboard and the like, coupled to the processor.

Moreover, according to an embodiment of the present disclosure, the processor is configured to provide, within the virtual mesh, a predefined number of precision levels. The predefined number may be either user-defined or system-defined by default.

Optionally, the precision levels are scalable. More optionally, the precision levels are scalable to a desired resolution, depending on a change in a size of the virtual mesh. Examples of how the precision levels can be scaled have been illustrated in conjunction with FIGS. 6 and 7.

Moreover, according to an embodiment of the present disclosure, the processor is configured to store the 3D model of the virtual object in a form of an editable file or in a 3D printable format.

Moreover, optionally, the processor is configured to store the 3D model of the virtual object at a local data storage of the apparatus. Additionally or alternatively, optionally, the processor is configured to store the 3D model of the virtual object at a remote server. Optionally, the remote server is implemented by way of a cloud computing service.

Furthermore, according to an embodiment of the present disclosure, the apparatus is implemented by way of a computing device. Examples of such computing devices include, but are not limited to, smart telephones, MIDs, tablet computers, UMPCs, phablet computers, PDAs, web pads, PCs, handheld PCs, laptop computers, desktop computers, and large-sized touchscreens with embedded PCs.

Optionally, in such a case, the display and the touch surface are implemented by way of a touchscreen display of the computing device. Alternatively, optionally, the touch surface is implemented by way of a touchpad of the computing device. The touchpad could be implemented as an in-built touchpad of the computing device or as an external touchpad that is communicably coupled to the computing device.

When the display and the touch surface are implemented by way of a touchscreen display, the aforementioned plurality of regions of the virtual mesh are mapped onto the plurality of regions located on the touchscreen display. In such a case, the apparatus enables the user to provide his/her inputs, namely apply force, over the virtual mesh displayed on the touchscreen display.

In a third aspect, embodiments of the present disclosure provide an apparatus for providing a UI for 3D modelling, the apparatus comprising:

a user input device comprising a touch surface; and
a computing device coupled in communication with the user input device,
wherein the computing device comprises:
a memory;
a processor coupled to the memory; and
a display coupled to the processor,
wherein the processor is configured to:
  display, on the display, a 3D model of a virtual object having at least one elementary shape;
  display, on the display, a virtual mesh over or aside at least a portion of the virtual object, wherein the virtual mesh comprises a plurality of regions;
  map the plurality of regions of the virtual mesh onto a plurality of regions located on the touch surface;
  detect a user's selection of a type and/or a shape of a modification to be performed on the 3D model of the virtual object;
  detect a force applied by the user on at least one region of the touch surface;
  determine at least one region of the virtual mesh corresponding to the at least one region of the touch surface;
  modify the at least one elementary shape of the virtual object corresponding to the at least one region of the virtual mesh, based upon the user's selection of the type and/or the shape of the modification to be performed; and
  display, on the display, the modified 3D model of the virtual object.

It will be appreciated that the processor pursuant to the third aspect is optionally configured to perform other operations as described in conjunction with the aforementioned first and second aspects.

Furthermore, an example of the user input device has been provided in conjunction with FIGS. 3 and 4A-C as explained in more detail below. According to an embodiment of the present disclosure, the touch surface comprises a plurality of force-sensing components for sensing a force applied thereat, and the user input device further comprises:

a communication interface; and
a controller coupled with the touch surface and the communication interface, wherein the controller is configured to read measurement data of the plurality of force-sensing components, and to communicate the measurement data to the computing device via the communication interface.

According to an embodiment of the present disclosure, the plurality of force-sensing components are implemented by way of a conductive polymer that changes a measurable property depending upon a force applied thereat. An example of such a conductive polymer is a force-sensing resistor that changes its resistance when a force is applied thereat.

It is to be noted here that depending on a type of conductive polymer used for implementing the plurality of force-sensing components, the conductive polymer may or may not be sensitive to slight bending. In a case when the conductive polymer is sensitive to even slight bending, the conductive polymer is beneficially applied to substantially flat surfaces in order to avoid surface tension that occurs during bending and to maintain a reasonable sensitivity and a dynamic range. In such a case, the conductive polymer is implemented as a plurality of stripes of the conductive polymer (hereinafter referred to as a plurality of conductive polymeric stripes, for the sake of convenience only).

Optionally, in this regard, the touch surface is made from a multi-layered flexible structure that comprises:

a first layer;
a second layer adjacent to the first layer, the second layer comprising a plurality of conductive stripes that are arranged substantially parallel to each other;
a third layer adjacent to the second layer, the third layer comprising a plurality of conductive polymeric stripes, wherein the plurality of conductive polymeric stripes are arranged substantially parallel to each other;
a fourth layer adjacent to the third layer, the fourth layer comprising a plurality of conductive stripes that are arranged substantially parallel to each other, wherein the plurality of conductive stripes of the fourth layer are substantially perpendicular to the plurality of conductive stripes of the second layer; and a fifth layer adjacent to the fourth layer, wherein the first and fifth layers protect the second, third and fourth layers.

Optionally, the plurality of conductive polymeric stripes are cut from a sheet of the conductive polymer. In order to maintain the sensitivity and the dynamic range of the conductive polymer, the plurality of conductive polymeric stripes are arranged in a manner that when the multi-layered flexible structure is bent in use, the plurality of conductive polymeric stripes are substantially perpendicular to a direction of bending of the multi-layered flexible structure. Optionally, in this regard, a width of these conductive polymeric stripes depends upon a shape and/or size of the user input device. In other words, optionally, the width depends upon a radius of curvature desired for the user input device. Optionally, the width ranges from 0.5 cm to 4 cm.

Optionally, the plurality of conductive polymeric stripes are electrically isolated from each other.

In an alternative implementation, the third layer comprises a continuous sheet of the conductive polymer, instead of the plurality of stripes of the conductive polymer. The continuous sheet is beneficially employed when the conductive polymer is not sensitive to slight bending.

Moreover, optionally, the plurality of conductive stripes of the second layer and the plurality of conductive stripes of the fourth layer are made of an electrically-conductive material. As an example, the electrically-conductive material can be a metal, such as gold, silver, aluminium and copper, or a metal alloy.

Optionally, the first and fifth layers are outermost layers. Alternatively, optionally, one or more additional protective layers are formed adjacent to the first layer and/or the fifth layer.

Optionally, the first and fifth layers provide electrical insulation and anti-static property to the multi-layered flexible structure.

Furthermore, optionally, the controller is configured to read a resistance of the conductive polymeric stripes, for example, by employing a row-column activation technique. The row-column activation technique is well known in the art.

Optionally, the controller of the user input device is implemented by way of a microcontroller.

Moreover, the communication interface can be either a wireless communication interface or a wired communication interface.

Optionally, the user input device also includes a configuration of sensors that are coupled with the controller. The configuration of sensors includes, but is not limited to, an accelerometer and a gyroscopic sensor. The controller is configured to receive, from the configuration of sensors, sensor data indicative of acceleration, rotation and/or orientation of the user input device, and to communicate the sensor data to the computing device via the communication interface.

Optionally, in this regard, the processor is configured to receive, from the user input device, the sensor data indicative of acceleration, rotation and/or orientation of the user input device; and to process the sensor data to move the virtual object in 3D space, so as to change an orientation and/or a zoom and/or an angle of view of the virtual object corresponding to the sensor data. Optionally, a change in the orientation and/or the zoom and/or the angle of view of the virtual object is displayed in real time or near real time.

Moreover, the user input device also includes a power source for supplying electrical power to various components of the user input device. The power source may, for example, include a rechargeable battery.

In one example implementation, the communication interface is a wired communication interface that couples the controller with the computing device, for example, via a Universal Serial Bus (USB) cable. In this implementation, the electrical power is supplied from the computing device itself.

Furthermore, according to an embodiment of the present disclosure, the user input device has a predefined shape. Optionally, the predefined shape is selected from the group consisting of a cylindrical shape, a cubical shape, a cuboidal shape, a spherical shape and a conical shape.

Optionally, the predefined shape of the user input device is substantially similar to the at least one elementary shape of the virtual object.

An example of the user input device has been illustrated in conjunction with FIGS. 4A-C as explained in more detail below. In the illustrated example, the user input device is cylindrical in shape. Optionally, in this regard, the touch surface of the user input device is formed by wrapping the aforementioned multi-layered flexible structure around a hollow cylinder.

Beneficially, the multi-layered flexible structure is wrapped around the hollow cylinder in a manner that the plurality of conductive polymeric stripes of the third layer are arranged substantially parallel to a longitudinal axis of the hollow cylinder.

Moreover, optionally, the controller is placed in a hollow portion of the hollow cylinder. Optionally, electrical connections between the controller and the multi-layered flexible structure are made via through-holes.

Optionally, the hollow cylinder is made of an electrically-insulating material. Optionally, the hollow cylinder has a radius ranging from 4 cm to 12 cm.

In another example, the user input device is cubical in shape. Optionally, in this regard, the touch surface of the user input device is formed by positioning substantially flat strips of the aforementioned multi-layered flexible structure on six faces of a cube.

Moreover, optionally, the controller of the user input device is placed in a hollow portion of the cube. Optionally, electrical connections between the controller and the multi-layered flexible structure are made via through-holes.

For illustration purposes only, there will now be considered an example of a 3D modelling process that is performed using a user input device pursuant to embodiments of the present disclosure.

When a user initiates the 3D modelling process, an initial view of a UI is rendered on a display of a computing device. In the initial view, the UI displays a 3D model of a virtual object having at least one elementary shape.

Optionally, the at least one elementary shape of the virtual object is substantially similar to a shape of a touch surface of the user input device that is used for the 3D modelling process. As an example, when the touch surface of the user input device is cylindrical in shape, the at least one elementary shape of the virtual object is a cylindrical shape. In such a case, optionally, a height-to-diameter ratio of the virtual object is substantially similar to a height-to-diameter ratio of the touch surface of the user input device by default.

Optionally, in this regard, the UI provides the user with a pre-editing feature that enables the user to change the height-to-diameter ratio of the virtual object before proceeding with the 3D modelling process.

Subsequently, a virtual mesh appears over the 3D model of the virtual object.

The UI also displays a plurality of user-selectable options for modifying the at least one elementary shape of the virtual object. Optionally, at least one of the plurality of user-selectable options corresponds to whether a mode of operation of the 3D modelling process is symmetric or asymmetric. Optionally, at least one of the plurality of user-selectable options corresponds to whether a modification to be performed is a protrusion or a depression. Optionally, at least one of the plurality of user-selectable options corresponds to a shape to be achieved after the modification is performed, for example, such as a curved shape, an angular shape, a concave shape, a convex shape, an up-pointing shape, a down-pointing shape, and so forth.

If the user selects a symmetric mode of operation, the virtual mesh appears as a plurality of rows. If the user selects an asymmetric mode of operation, the virtual mesh appears as a grid having a plurality of rows and a plurality of columns.

The user then places the virtual mesh on at least a portion of the virtual object that he/she desires to modify by translating and/or resizing the virtual mesh.

As mentioned earlier, the virtual mesh has a predefined number of precision levels. When the virtual mesh is resized, the precision levels are scaled to a new resolution.

Now, when the user applies a force on a desired region of the touch surface of the user input device, the at least one elementary shape of the virtual object is modified correspondingly.

Moreover, optionally, the UI provides the user with an option to undo one or more recent modifications performed on the virtual object.

If the user does not interact with the user input device for a predefined time period, the 3D modelling process is finished. The predefined time period is either user-defined or system-defined by default.

Optionally, the UI provides the user with an option to store the 3D model of the virtual object in an editable format. Additionally, optionally, the UI provides the user with an option to print the 3D model of the virtual object.

For illustration purposes only, there will next be considered an example of a 3D modelling process that is performed using a touchscreen display of a computing device pursuant to embodiments of the present disclosure.

When a user initiates the 3D modelling process, an initial view of a UI is rendered on the touchscreen display of the computing device. In the initial view, the UI displays a 3D model of a virtual object having at least one elementary shape.

Subsequently, a virtual mesh appears over or aside at least a portion of the 3D model of the virtual object.

The UI also displays a plurality of user-selectable options for modifying the at least one elementary shape of the virtual object, as described earlier.

If the user selects a symmetric mode of operation, the virtual mesh appears as a plurality of rows. If the user selects an asymmetric mode of operation, the virtual mesh appears as a grid having a plurality of rows and a plurality of columns.

Optionally, the user places the virtual mesh over at least a portion of the virtual object that he/she desires to modify by translating and/or resizing the virtual mesh.

Regions of the virtual mesh are mapped onto regions of the touchscreen display. Thus, when the user applies a force on a desired region of the touchscreen display, the at least one elementary shape of the virtual object is modified correspondingly.

Detailed Description of Drawings

Referring now to the drawings, particularly by their reference numbers, FIG. 1 is an illustration of steps of a method of providing a user interface (UI) for three-dimensional (3D) modelling, via an apparatus comprising a touch surface, in accordance with an embodiment of the present disclosure. The method is depicted as a collection of steps in a logical flow diagram, which represents a sequence of steps that can be implemented in hardware, software, or a combination thereof.

At a step 102, a 3D model of a virtual object having at least one elementary shape is displayed.

At a step 104, a virtual mesh is displayed over or aside at least a portion of the virtual object.

At a step 106, a plurality of regions of the virtual mesh are mapped onto a plurality of regions located on the touch surface.

At a step 108, a user's selection of a type and/or a shape of a modification to be performed on the 3D model of the virtual object is detected.

At a step 110, a force applied by the user on at least one region of the touch surface is detected.

Subsequently, at a step 112, at least one region of the virtual mesh is determined corresponding to the at least one region of the touch surface.

At a step 114, the at least one elementary shape of the virtual object is modified corresponding to the at least one region of the virtual mesh, based upon the user's selection of the type and/or the shape of the modification to be performed.

At a step 116, the modified 3D model of the virtual object is displayed.

The steps 102 to 116 are only illustrative and other alternatives can also be provided where one or more steps are added, one or more steps are removed, or one or more steps are provided in a different sequence without departing from the scope of the claims herein.

Figure 2:
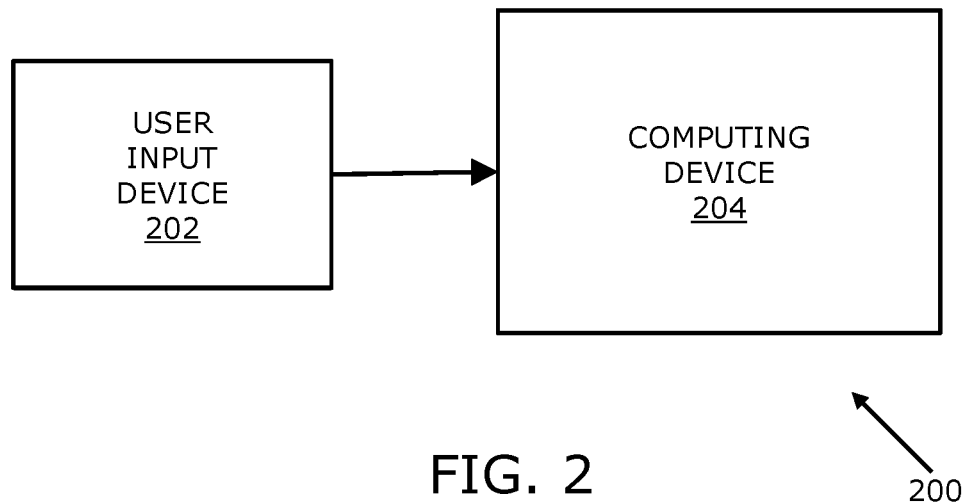
FIG. 2 is a schematic illustration of an apparatus for providing a UI for 3D modelling, in accordance with an embodiment of the present disclosure.

FIG. 2 is a schematic illustration of an apparatus 200 for providing a UI for 3D modelling, in accordance with an embodiment of the present disclosure. The apparatus 200 includes a user input device 202 and a computing device 204.

FIG. 2 is merely an example, which should not unduly limit the scope of the claims herein. It is to be understood that the specific designation for the apparatus 200 is provided as an example and is not to be construed as limiting the apparatus 200 to specific numbers or types of user input devices and computing devices. A person skilled in the art will recognize many variations, alternatives, and modifications of embodiments of the present disclosure. In an example implementation, two or more user input devices of mutually different shapes are used together with a computing device, for example, to enable 3D modelling of a virtual object having a complex shape.

Figure 3:
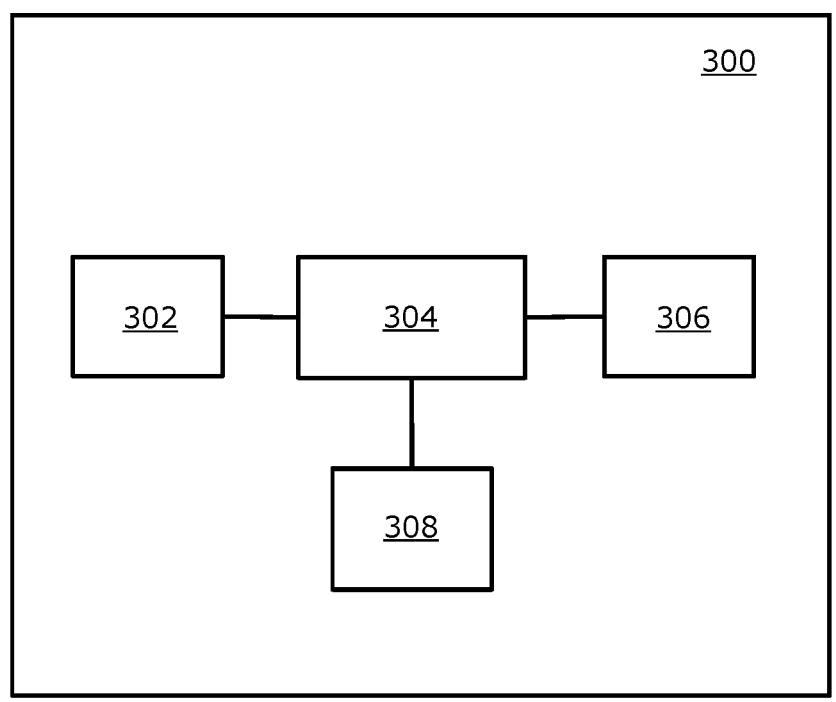
FIG. 3 is a schematic illustration of various components of a user input device, in accordance with an embodiment of the present disclosure.

FIG. 3 is a schematic illustration of various components of a user input device 300, in accordance with an embodiment of the present disclosure. The user input device 300 includes, but is not limited to, a touch surface 302, a controller 304, a communication interface 306 and a power source 308.

FIG. 3 is merely an example, which should not unduly limit the scope of the claims herein. It is to be understood that the specific designation for the user input device 300 is provided as an example and is not to be construed as limiting the user input device 300 to specific numbers, types, or arrangements of modules and/or components of the user input device 300. A person skilled in the art will recognize many variations, alternatives, and modifications of embodiments of the present disclosure. For example, the user input device 300 could be implemented as the user input device 202, and vice versa.

Figure 4A:
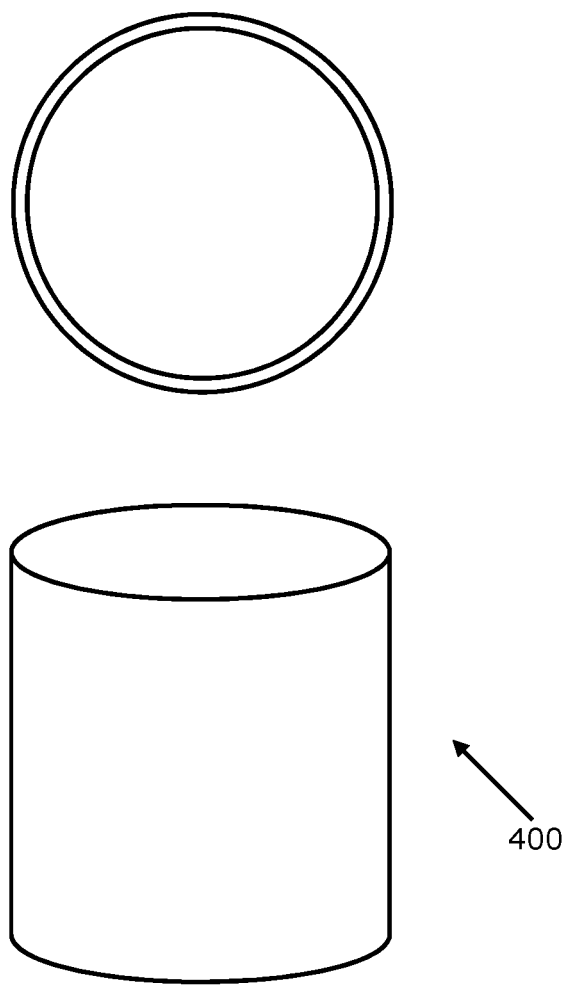
FIGS. 4A, 4B and 4C are schematic illustrations of an example implementation of a user input device, in accordance with an embodiment of the present disclosure.
Figure 4B:
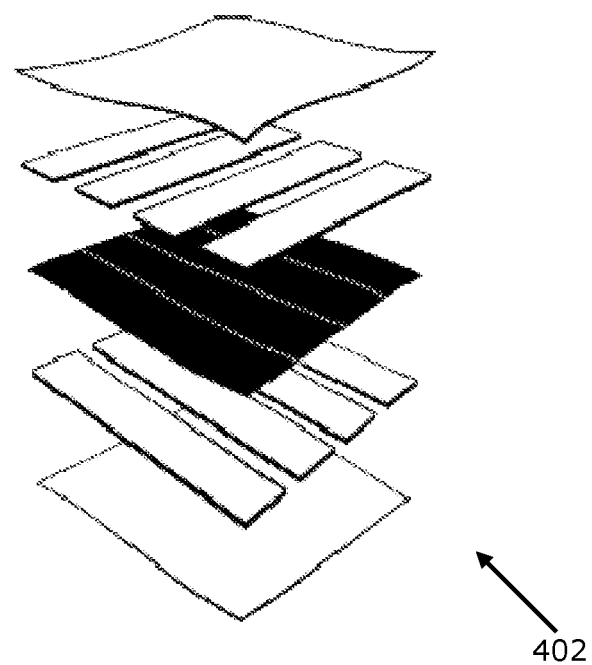
Figure 4C:
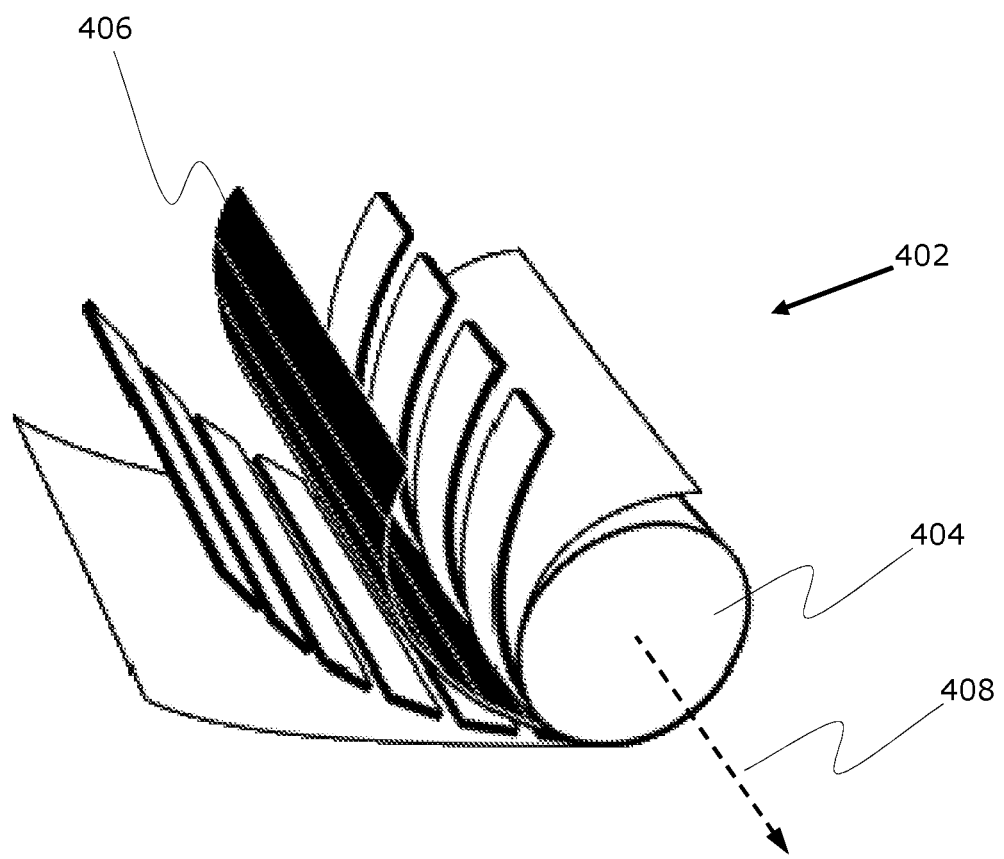

FIGS. 4A, 4B and 4C are schematic illustrations of an example implementation of a user input device 400, in accordance with an embodiment of the present disclosure.

In FIG. 4A, there are shown front and top views of the user input device 400. With reference to FIG. 4A, the user input device 400 is cylindrical in shape.

In FIG. 4B, there is shown an exploded view of a multi-layered flexible structure 402.

With reference to FIG. 4C, a touch surface of the user input device 400 is formed by wrapping the multi-layered flexible structure 402 around a hollow cylinder 404. The multi-layered flexible structure 402 includes a plurality of stripes of a conductive polymer 406. The multi-layered flexible structure 402 is wrapped around the hollow cylinder 404 in a manner that the plurality of stripes of the conductive polymer 406 are arranged substantially parallel to a longitudinal axis 408 of the hollow cylinder 404.

In an alternative implementation, the conductive polymer 406 is in a form of a continuous sheet, instead of the plurality of stripes.

Optionally, a controller (not shown) and a communication interface (not shown) of the user input device 400 are placed in a hollow portion of the hollow cylinder 404.

FIGS. 4A-C are merely examples, which should not unduly limit the scope of the claims herein. A person skilled in the art will recognize many variations, alternatives, and modifications of embodiments of the present disclosure.

Figure 5:
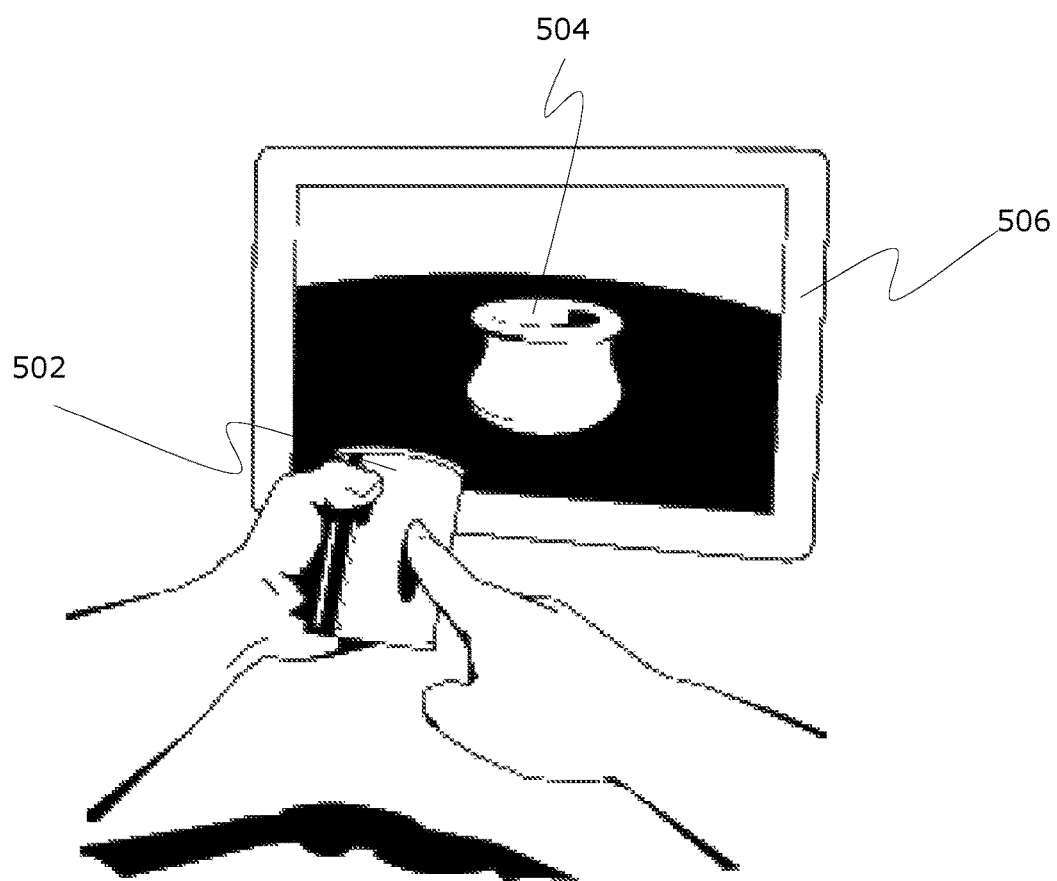
FIG. 5 is a schematic illustration of a 3D modelling process being performed using a user input device, in accordance with an embodiment of the present disclosure.

FIG. 5 is a schematic illustration of a 3D modelling process being performed using a user input device 502, in accordance with an embodiment of the present disclosure.

When a user applies a force on a touch surface of the user input device 502, a shape of a virtual object 504 displayed on a display 506 of a computing device is modified correspondingly.

FIG. 5 is merely an example, which should not unduly limit the scope of the claims herein. A person skilled in the art will recognize many variations, alternatives, and modifications of embodiments of the present disclosure.

FIG. 6 is a schematic illustration of how precision levels of a virtual mesh are scaled when a 3D modelling process is performed, in accordance with an embodiment of the present disclosure.

For illustration purposes only, there will now be considered that a symmetric mode of operation is selected for the 3D modelling process.

An initial view 602 of a UI shows a 3D model of a virtual object that is cylindrical in shape. In the initial view 602, the virtual mesh is shown as a plurality of rows that correspond to the precision levels of the virtual mesh.

With reference to FIG. 6, the number of precision levels is 10. It will be appreciated that the number of precision levels is not limited to 10, and can be any number, for example, such as 5, 20, 100 and so on.

A user selects a depression type of modification and applies a force at two regions on a touch surface of an apparatus. Correspondingly, the shape of the virtual object is modified symmetrically to form two depressions on the virtual object, as shown in a view 604 of the UI.

The user then resizes the virtual mesh to cover a middle portion of the virtual object, namely a portion between the two depressions. Accordingly, the precision levels of the virtual mesh scale to a higher resolution, as shown in a view 606 of the UI.

Next, the user selects a protrusion type of modification and applies a force at a desired region on the touch surface of the apparatus. Correspondingly, the shape of the virtual object is modified symmetrically to form a protrusion on the virtual object, as shown in a view 608 of the UI.

For illustration purposes only, there will now be considered that the user selects an option for undoing a most recent change. Consequently, the view 606 of the UI is rendered again.

Now, the user selects a depression type of modification and applies a force at a desired region on the touch surface of the apparatus. Correspondingly, the shape of the virtual object is modified symmetrically to form a depression on the virtual object, as shown in a view 610 of the UI.

FIG. 6 is merely an example, which should not unduly limit the scope of the claims herein. A person skilled in the art will recognize many variations, alternatives, and modifications of embodiments of the present disclosure.

FIG. 7 is a schematic illustration of how precision levels of a virtual mesh are scaled when a 3D modelling process is performed, in accordance with an embodiment of the present disclosure.

For illustration purposes only, there will now be considered that an asymmetric mode of operation is selected for the 3D modelling process.

An initial view 702 of a UI shows a 3D model of a virtual object that is cuboidal in shape. In the initial view 702, a virtual mesh 704 is placed on a portion of the virtual object in a form of a 3×3 grid.

A user selects a protrusion type of modification and applies force of different magnitudes at different regions on a touch surface of an apparatus as indicated by five arrows at the top portion of FIG. 7. Correspondingly, the shape of the virtual object is modified asymmetrically to form protrusions of different lengths on the virtual object, as shown in a view 706 of the UI.

Next, the user resizes and translates the virtual mesh 704 to place it on another portion of the virtual object, as shown in the view 706 of the UI.

The user then selects a depression type of modification and applies force of different magnitudes at different regions on the touch surface of the apparatus as indicated by two arrows at the top portion of FIG. 7. Correspondingly, the shape of the virtual object is modified asymmetrically to form depressions of different depths on the virtual object, as shown in a view 708 of the UI.

Next, the user resizes and translates the virtual mesh 704 to place it on yet another portion of the virtual object, as shown in the view 708 of the UI.

The user then selects a depression type of modification and applies force at a desired region on the touch surface of the apparatus as indicated by a single arrow on the top portion of FIG. 7. Correspondingly, the shape of the virtual object is modified asymmetrically to form a depression on the virtual object, as shown in a view 710 of the UI.

It will be appreciated that the aforementioned arrows in the top portion of FIG. 7 have been shown for illustration purposes only, and may or may not form a part of a view of the UI.

FIG. 7 is merely an example, which should not unduly limit the scope of the claims herein. A person skilled in the art will recognize many variations, alternatives, and modifications of embodiments of the present disclosure.

Modifications to embodiments of the present disclosure described in the foregoing are possible without departing from the scope of the present disclosure as defined by the accompanying claims. Expressions such as "including", "comprising", "incorporating", "consisting of", "have", "is" used to describe and claim the present disclosure are intended to be construed in a non-exclusive manner, namely allowing for items, components or elements not explicitly described also to be present. Reference to the singular is also to be construed to relate to the plural.

What is claimed is:

1. A method of modelling a three-dimensional object, via an apparatus comprising a three-dimensional touch sensitive user input device having a pre-defined three-dimensional shape, and a computing device coupled in communication with the three-dimensional touch sensitive user input device, the method comprising:
  displaying, on a display of the computing device, a three-dimensional model of a virtual object having at least one elementary shape, the at least one elementary shape corresponding to the pre-defined three dimensional shape of the three-dimensional touch sensitive user input device;
  displaying a virtual mesh over at least a portion of the virtual object on the display of the computing device, wherein the virtual mesh comprises a plurality of regions;
  mapping a plurality of regions of a touch surface of the three-dimensional touch sensitive user input device onto corresponding ones of the plurality of regions of the virtual mesh;
  detecting a selection via the computing device of a type and a shape of a modification to be performed on the three-dimensional model of the virtual object displayed on the display of the apparatus;
  detecting a force applied to at least one region of the plurality of regions of the touch surface of the three-dimensional touch sensitive user input device;
  determining one or more regions of the plurality of regions of the virtual mesh that correspond to the at least one region of the touch surface of the three dimensional touch sensitive user input device to which the detected force was applied;
  modifying the at least one elementary shape of the virtual object corresponding to the at least one region of the virtual mesh, based upon the user's selection of the type and the shape of the modification to be performed; and
  displaying the modified three-dimensional model of the virtual object on the display of the computing device.

2. The method as claimed in claim 1, wherein the method comprises detecting a selection of one or more regions of the three-dimensional model of the virtual object to be modified by detecting a touching of the at least one region of the plurality of regions of the touch surface of the three-dimensional touch sensitive user input device.

3. The method as claimed in claim 2, wherein the detected force applied to the at least one regions of the plurality of regions of the touch surface of the three-dimensional touch sensitive user interface can be mapped as a selection of one or more regions of an outer or inner surface of the virtual object.

4. The method as claimed in claim 1, wherein the modification of the virtual model on the display of the computing device is performed based upon an extent of the force applied and/or a duration for which the force is applied to the touch surface of the three-dimensional touch sensitive user input device.

5. The method as claimed in claim 1, wherein the method comprises enabling a user to translate and/or resize one or more regions of the virtual mesh of the virtual model.

6. The method as claimed in claim 1, wherein the method comprises providing, within the virtual mesh, a predefined number of regions that can be subdivided for further selection and modification.

7. An apparatus with a user interface for three-dimensional modelling, the apparatus comprising:
  a user input device with a touch surface, the user input device comprising a three-dimensional touch sensitive user input device having a pre-defined three-dimensional shape; and
  a computing device coupled in communication with the user input device, wherein the computing device comprises:
  a memory;
  a processor coupled to the memory; and
  a display coupled to the processor,
  wherein the processor is configured to:
    display, on the display, a three-dimensional model of a virtual object having at least one elementary shape, the at least one elementary shape corresponding to the pre-defined three dimensional shape of the three-dimensional touch sensitive user input device;
    display, on the display, a virtual mesh over at least a portion of the displayed virtual object, wherein the virtual mesh comprises a plurality of regions;
    map a plurality of regions of the touch surface of the three-dimensional touch sensitive user input device onto corresponding ones of the plurality of regions of the virtual mesh;
    detect a user's selection of a type and a shape of a modification to be performed on the three-dimensional model of the virtual object;
    detect a force applied to at least one region of the plurality of regions of the touch surface of the three-dimensional touch sensitive user input device;
    determine at least one region of the virtual mesh corresponding to the at least one region of the touch surface of the three dimensional touch sensitive user input device to which the detected force was applied;
    modify the at least one elementary shape of the virtual object corresponding to the at least one region of the virtual mesh, based upon the user's selection of the type and the shape of the modification to be performed and the detected force applied to the three-dimensional touch sensitive user input device; and
    display, on the display, the modified three-dimensional model of the virtual object.

8. The apparatus as claimed in claim 7, wherein the touch surface comprises a plurality of force-sensing components for sensing a force applied thereat, and wherein the user input device further comprises:
  a communication interface; and
  a controller coupled with the touch surface and the communication interface, wherein the controller is configured to read measurement data of the plurality of force-sensing components, and to communicate the measurement data to the computing device via the communication interface.

9. The apparatus as claimed in claim 8, wherein the plurality of force-sensing components are implemented by way of a conductive polymer that changes a measurable property depending upon a force applied thereat.

10. The apparatus as claimed in claim 8, wherein the user input device further comprises a configuration of sensors that are coupled with the controller, and wherein the processor is configured to receive, from the user input device, sensor data indicative of acceleration, rotation and/or orientation of the user input device; and to process the sensor data to move the virtual object in three-dimensional space, so as to change an orientation and/or a zoom and/or an angle of view of the virtual object corresponding to the sensor data.

11. The apparatus as claimed in claim 7, wherein the predefined three-dimensional shape of the three-dimensional touch sensitive user input device is selected from the group consisting of a cylindrical shape, a cubical shape, a cuboidal shape, a spherical shape and a conical shape.

* * * * *